(12) United States Patent
Constantz

(10) Patent No.: US 10,947,133 B2
(45) Date of Patent: *Mar. 16, 2021

(54) UNDERWATER SYSTEMS HAVING CO-LOCATED DATA CENTER AND WATER DESALINATION SUBUNITS

(71) Applicant: DeepWater Desal LLC, Moss Landing, CA (US)

(72) Inventor: Brent R. Constantz, Portola Valley, CA (US)

(73) Assignee: DeepWater Desal LLC, Moss Landing, CA (US)

( * ) Notice: Subject to any disclaimer, the term of this patent is extended or adjusted under 35 U.S.C. 154(b) by 86 days.

This patent is subject to a terminal disclaimer.

(21) Appl. No.: 16/248,009

(22) Filed: Jan. 15, 2019

(65) Prior Publication Data

US 2019/0218115 A1    Jul. 18, 2019

Related U.S. Application Data

(63) Continuation of application No. 14/852,280, filed on Sep. 11, 2015, now Pat. No. 10,221,083.

(Continued)

(51) Int. Cl.
*C02F 1/44* (2006.01)
*H05K 7/14* (2006.01)
(Continued)

(52) U.S. Cl.
CPC ............... *C02F 1/441* (2013.01); *G06F 1/20* (2013.01); *H05K 7/1497* (2013.01);
(Continued)

(58) Field of Classification Search
CPC ............ C02F 1/441; C02F 2103/08; C02F 2103/023; C02F 2201/009; C02F 2303/10;
(Continued)

(56) References Cited

U.S. PATENT DOCUMENTS 5,979,363 A    11/1999 Shaar
6,833,056 B1   12/2004 Kamiya et al.
(Continued)

FOREIGN PATENT DOCUMENTS

GB    1260214 A    1/1972
GB    2400603 A    10/2004
(Continued)

OTHER PUBLICATIONS

Briand, Effects of power-plant cooling systems on marine phytoplankton, Marine Biology (1975), 33(2):135-146, Abstract Only.
(Continued)

*Primary Examiner* — Krishnan S Menon
(74) *Attorney, Agent, or Firm* — Peter W. Schroen; Bret E. Field; Bozicevic, Field & Francis LLP

(57) ABSTRACT

Underwater systems for data center cooling and water desalination are provided. Aspects of the systems include a data center subunit and a desalination subunit that are co-located with each other at an underwater location, where the desalination subunit is configured to receive warm water output from the data center. Aspects of the invention also include methods for cooling a data center and desalinating water using underwater systems as described herein.

13 Claims, 2 Drawing Sheets

Related U.S. Application Data

(60) Provisional application No. 62/051,223, filed on Sep. 16, 2014.

(51) Int. Cl.
*H05K 7/20* (2006.01)
*G06F 1/20* (2006.01)
*C02F 103/08* (2006.01)
*C02F 103/02* (2006.01)

(52) U.S. Cl.
CPC ...... *H05K 7/2079* (2013.01); *C02F 2103/023* (2013.01); *C02F 2103/08* (2013.01); *C02F 2201/009* (2013.01); *C02F 2303/10* (2013.01); *Y02A 20/131* (2018.01); *Y02A 20/212* (2018.01); *Y02W 10/30* (2015.05)

(58) Field of Classification Search
CPC .. Y02A 20/131; Y02A 20/212; H05K 7/1497; H05K 7/2079; G06F 1/20; Y02W 10/30
See application file for complete search history.

(56) References Cited

U.S. PATENT DOCUMENTS

| | | | |
|---|---|---|---|
| 7,525,207 | B2 | 4/2009 | Clidaras et al. |
| 7,886,537 | B2 | 2/2011 | Jagusztyn et al. |
| 8,322,139 | B2 | 12/2012 | Takahashi et al. |
| 8,567,195 | B2 | 10/2013 | Nash |
| 2007/0131534 | A1 | 6/2007 | Capan |
| 2008/0209234 | A1 | 8/2008 | Clidaras et al. |
| 2009/0078401 | A1* | 3/2009 | Cichanowicz ......... F22D 1/003 165/299 |
| 2009/0230686 | A1 | 9/2009 | Catlin |
| 2009/0295167 | A1 | 12/2009 | Clidaras et al. |
| 2010/0237015 | A1 | 9/2010 | Voutchkov |
| 2010/0270237 | A1 | 10/2010 | Efraty |
| 2011/0225997 | A1 | 9/2011 | Gast, Jr. et al. |
| 2012/0011849 | A1 | 1/2012 | Cole et al. |
| 2012/0055857 | A1 | 3/2012 | Marin et al. |
| 2012/0091729 | A1 | 4/2012 | Nash |
| 2012/0138259 | A1 | 6/2012 | Carlson |
| 2012/0247149 | A1 | 10/2012 | Labelle |
| 2013/0042612 | A1 | 2/2013 | Shapiro et al. |
| 2014/0254084 | A1 | 9/2014 | Patel |
| 2015/0090647 | A1 | 4/2015 | Duke et al. |

FOREIGN PATENT DOCUMENTS

| | | |
|---|---|---|
| JP | 2010-267707 A | 11/2010 |
| KR | 1000954233 B1 | 4/2010 |
| KR | 10-2011-0037589 A | 4/2011 |
| KR | 10-2011-0075384 A | 7/2011 |
| WO | WO2011047482 A1 | 4/2011 |
| WO | WO2013184820 A1 | 12/2013 |
| WO | WO2014151044 A1 | 9/2014 |
| WO | WO2014151058 A1 | 9/2014 |

OTHER PUBLICATIONS

Emura et al., Pumping Of Low-Temperature Deep Sea Water For Cooling Of Facilities On Land, Oceans '83, Proceedings, Aug. 29-Sep. 1, 1983, San Francisco, pp. 871-874, Abstract Only.
Nakasone et al., The Application of Deep Sea Water in Japan, UJNR Technical Report No. 28, pp. 69-75, Accessed on Jan. 21, 2015.
Smith, The AC of Tomorrow? Tapping Deep Water for Cooling, National Geographic News (2004), http://news.nationalgeographic.com/news/2004/09/0910_040910_deeplake_2_html, 3 pages.
Makai Ocean Engineering, http://www.makai.com/pipelines/ac-pipelines/, 8 pages, Accessed on Jan. 21, 2015.
Once Through Cooling, http://www.healthebay.org/about-bay/current-policy-issues/keeping-animals-healthy/open-ocean-intakes, 2 pages, Accessed on Jan. 16, 2015.
Cooling Power Plants, http://www.world-nuclear.org/info/current-and-future-generationicooling-power-plants/, 14 pages, Accessed on Jan. 16, 2015.
Power Plants Using Once Through Cooling, http://www.cacoastkeeper.org/programs/healthy-marine-habitats/power-plants-otc, 5 pages, Accessed on Jan. 16, 2015.
Elimelech et al., The future of seawater desalination: energy, technology, and the environment, Science (2011), 333(6043):712-717.
Brady et al., A case study and critical assessment in calculating power usage effectiveness for a data centre, Energy Conversion and Management, vol. 76, Dec. 2013, pp. 155-161.

\* cited by examiner

UNDERWATER SYSTEMS HAVING CO-LOCATED DATA CENTER AND WATER DESALINATION SUBUNITS

CROSS-REFERENCE TO RELATED APPLICATIONS

This application is a continuation of United States application Ser. No. 14/852,280 filed Sep. 11, 2015, now United States Pat. No. 10,221,083, which application, pursuant to 35 U.S.C. § 119 (e), claims priority to the filing date of the United States Provisional patent application Ser. No. 62/051,223 filed Sep. 16, 2014; the disclosure of which applications are herein incorporated by reference.

INTRODUCTION

In recent years, internet traffic in the United States has risen significantly. It is estimated that in the United States, internet traffic increased from 40,000-70,000 terabytes/month in 2001 to 3,400,000-4,100,000 terabytes/month in 2011. To support the steep growth in internet traffic, a large amount of computer-related infrastructure has been developed and implemented. One type of infrastructure that has been increasingly utilized is data centers.

Data centers are facilities that house computer systems and associated components for operation therein. Data centers may include computers, data storage devices, servers, telecommunications systems or other related equipment and may be used to manage, store, process and/or exchange digital information and data. The operation of electrical components within data centers for these functions produces a large amount of heat. As such, many data centers have intricate cooling systems designed to cool electrical components so that the components can function effectively.

Operation of electrical components and cooling systems within data centers often requires a large amount of energy. Data center power use can range from several kW to several tens of MW. Data centers may use, for example, as much electricity as a small town to operate. The power density of a data center may also be more than one-hundred times that of a typical office building.

Due to the high power usage of data centers, data centers are also often responsible for high carbon emissions. For example, it is estimated that in 2007 data centers were responsible for 1.5% of the total electricity consumption in the United States. Likewise, data centers were estimated to be responsible for 0.5% of greenhouse gas emissions in the United States in the same year. The amount of greenhouse gas emissions from data centers is also expected to rise in the future. For example, it is projected that greenhouse gas emission from data centers will double from 2007 levels by 2020.

Also in recent years, scarcity of fresh water has become an increasing problem facing humanity. More than 97% of water on earth is seawater; three fourths of the remaining water is locked in glacier ice; and less than 1% is in aquifers, lakes and rivers that can be used for agriculture, industrial, sanitary and human consumption. As water in aquifers, lakes and rivers is a renewable resource, this small fraction of the Earth's water is continually reused. It is the rate of this reuse that has stressed conventional water resources. In the last century, these water sources became stressed as growing population and pollution limited the availability of easy-to-access freshwater.

SUMMARY

Underwater systems for data center cooling and water desalination are provided. Aspects of the systems include a data center subunit and a desalination subunit that are co-located with each other at an underwater location, where the desalination subunit is configured to receive warm water output from the data center. Aspects of the invention also include methods for cooling a data center and desalinating water using underwater systems as described herein.

DETAILED DESCRIPTION

Figure 1:
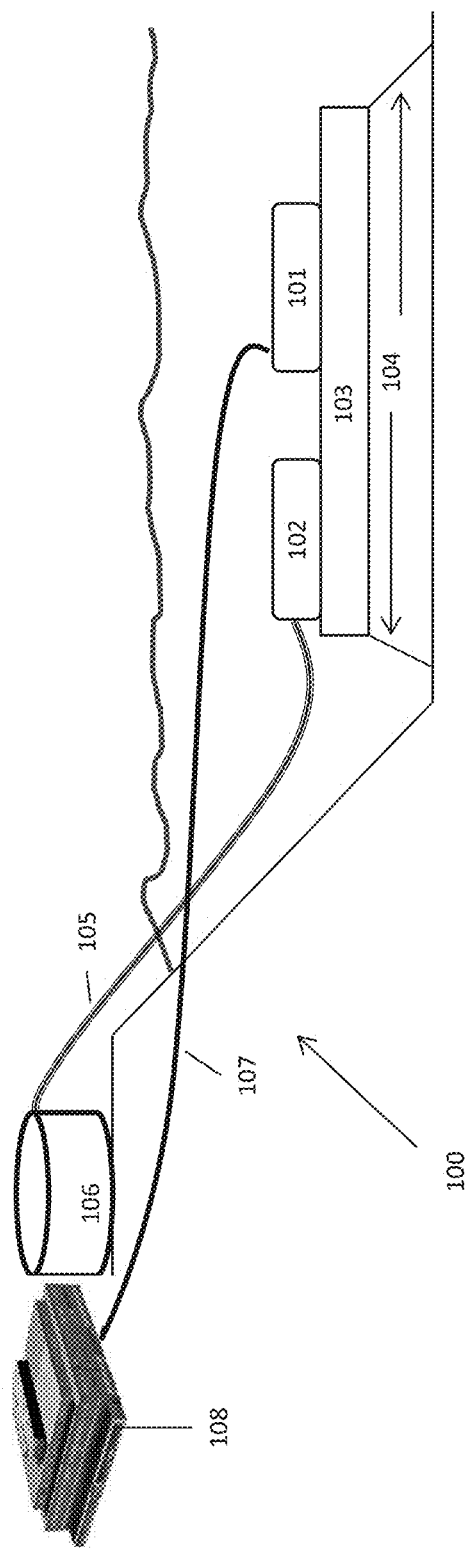
FIG. 1 is a diagram of an underwater system including co-located data center and water desalination subunits, in accordance with an embodiment of the invention.

Underwater systems for data center cooling and water desalination are provided. Aspects of the systems include a data center subunit and a desalination subunit that are co-located with each other at an underwater location, where the desalination subunit is configured to receive warm water output from the data center. Aspects of the invention also include methods for cooling a data center and desalinating water using underwater systems as described herein.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, some potential and exemplary methods and materials may now be described. Any and all publications mentioned herein are incorporated herein by reference to disclose and describe the methods and/or materials in connection with which the publications are cited. It is understood that the present disclosure supersedes any disclosure of an incorporated publication to the extent there is a contradiction.

It must be noted that as used herein and in the appended claims, the singular forms "a", "an", and "the" include plural referents unless the context clearly dictates otherwise. Thus, for example, reference to "an intake" includes a plurality of such intakes and reference to "the material" includes reference to one or more materials and equivalents thereof known to those skilled in the art, and so forth.

It is also noted that definitions provided in one section of this application (e.g., the "Systems" section) may also apply to embodiments described in another section of the application (e.g., the "Methods" section) even if a term is described as applying to an embodiment of a particular section.

It is further noted that the claims may be drafted to exclude any element which may be optional. As such, this statement is intended to serve as antecedent basis for use of such exclusive terminology as "solely", "only" and the like in connection with the recitation of claim elements, or the use of a "negative" limitation.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. To the extent such publications may set out definitions of a term that conflict with the explicit or implicit definition of the present disclosure, the definition of the present disclosure controls.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Systems

As summarized above, underwater systems that include a co-located data center and water desalination subunits are provided. The systems include a data center subunit having a water cooling subsystem configured to receive and output water (e.g., cool and warm water, respectively) and a desalination subunit co-located with the data center and configured to receive and desalinate the output water (e.g., warm water), where the two subunits are co-located at an underwater location. The terms "co-locate", "co-located" and "co-locating", as used herein refer to placing two or more things in proximity to each other (i.e., within a certain distance of each other). In some aspects of the disclosed systems, co-located sub-units may be located such that they share one or more common aspects (e.g., facilities or components such as specific systems or machinery). In some aspects, co-located sub units may be located, for example, within 0.1 m to 100 m, such as 0.1 to 50 m, including 0.1 to 10 m, e.g., 0.1 to 1 m, of one another. In some aspects, co-located sub units are integrated with each other, such that there is not distinct distance separate one subunit from the other. In some embodiments, co-located units are two or more facilities located in immediately adjacent or abutting areas of an underwater location. In some embodiments, co-located units are two or more facilities located in the same area of an underwater location. In some versions of the disclosed systems, co-located subunits are located such that they are in fluid communication (i.e., the subunits are configured such that at least one fluid may move and/or flow between the subunits). In some variations of the disclosed systems, co-located units are located such that they share one or more of the components described herein (e.g., a water cooling subsystem). In some embodiments of the disclosed systems, co-located subunits may be located such that they are electrically connected (i.e., connected by at least one conductive material) and/or share at least one electrical component. In some instances, co-located subunits are located such that their location allows them to be more energy-efficient (i.e., use less energy for the same amount of productivity) than the subunits would be if they were located in a different position (e.g., a greater distance away from each other). In various embodiments, co-located subunits are located such that their location allows them to produce fewer carbon emissions (e.g., carbon dioxide emissions) or have a smaller carbon footprint than the subunits would if they were located in a different position (e.g., a greater distance away from each other). In some versions, co-located subunits are located such that their location allows them to minimize potential pollutants emitted therefrom. In some embodiments of the disclosed systems, co-located units are located such that they are operably connected. By "operably connected", as used herein, is meant connected in a specific way (e.g., in a manner allowing water to move and/or electric power to be transmitted) that allows the disclosed system and its various components to operate effectively in the manner described herein. For example, a power producing subunit operably connected to a data center allows electricity to flow (i.e., be transmitted along at least one conductive material) between the power producing subunit and the data center such that the energy required to operate the data center would be at least partially obtained from the power plant.

As summarized above, the co-located data center and water desalination subunits of systems described herein are co-located at an underwater location. By underwater location is meant a location in a body of water that is underneath the surface of the body of water. In some aspects, the systems are positioned below and/or within a particular zone (e.g., euphotic and/or disphotic, and/or aphotic zone and/or benthic zone) in a body of water. In some instances, the systems are positioned below the photic zone in a body of water. In some instances, the underwater location is positioned at a depth of 15 m or more in a body of water, such as 20 m or more; 25 m or more; 30 m or more; 35 m or more; 40 m or more; 45 m or more; 50 m or more; 60 m or more; 70 m or more; 80 m or more; 90 m or more; 100 m or more; 200 m or more; 300 m or more in a water source, where an upper limit in some instances may be 5000 m or less, such as 2500 m or less, e.g., 1000 m or less. The systems described herein may be positioned at an underwater location of any convenient body of water. Examples of bodies of water include lakes, seas, oceans, etc. In some instances, the body of water is a body of saline water, where saline bodies of water include, but are not limited to oceans, e.g., the Pacific Ocean, the Atlantic Ocean, the Indian Ocean, the Antarctic Ocean and the Arctic Ocean, and seas, e.g., the Mediterranean Sea, the Baltic Sea, the Caribbean Sea, the Persian Gulf, the Red Sea, the Caspian Sea, etc.

The system and subunits thereof may be present in the same housing or disparate housings operatively connected to each other, e.g., as described below. As desired, the system may be fixed in a fixed or non-fixed underwater location, relative to a solid mass, e.g., floor, wall, underwater mountain, etc., of the body of water in which it is located. When fixed, the system may be present the solid mass or tethered thereto, as desired.

Various aspects of the embodiments of the systems will now be described in greater detail below.

Data Center

Embodiments of the disclosed systems include one or more data centers subunits. The term "data center" refers to a facility configured and/or used for physically housing (i.e., containing within it) one or more computer systems and/or associated components. In some embodiments, data centers include the components therein and manage, store, process and/or exchange digital information and data.

Data centers may include computers, data storage devices, servers (e.g., web servers, database servers and/or application servers), switches, routers, vaults, load balancers, racks, wire cages or closets and/or related equipment. Data centers may include redundant data communications connections, backup or redundant power supplies, security devices, and/or fire suppression systems. In some instances, data centers include data storage systems and/or telecommunications systems. Some versions of data centers are used for providing application services or management for various types of data processing (e.g., intranet, web hosting internet). In some embodiments, data centers are used, for example, to operate and manage one or more carriers' telecommunication network, provide data center applications directly to one or more carriers' customers and/or provide hosted applications for one or more third parties to provide services to customers. Embodiments of data centers include data centers that are within one or more buildings. In some aspects, data centers occupy one or more rooms of a building, one or more floors of a building or an entire building.

In some instances, data centers are electrically powered. For example, some embodiments of data centers consume electricity to operate. Power draw for data centers may range from a few kW (e.g., one, two, three, four or five kW) to several tens of MW (e.g., one, two, three, four, five, six, seven, eight or nine tens of MW) for larger facilities. In some aspects of data centers, the data centers have power densities of more than one-hundred times that of an average office building. In some embodiments of data centers, electricity costs are the primary operating expense of the data center and may account for 10% or more of a data center's total cost of ownership.

Embodiments of data centers are operably connected to at least one power source (e.g., one or more power producing subunits, as described herein, or other power sources). Some versions of data centers include a power source (e.g., a source from which electrical power may be obtained). Power sources, in some embodiments, generate or obtain power from renewable energy sources. Renewable energy sources include, for example, one or more systems or devices configured to convert one or more forms of energy (e.g., solar, wind, wave, biofuel, biomass, tidal and/or geothermal energy) to another form (e.g., electric power). For example, a power source may be one or more solar panels, wind turbines, wave power generators, etc.

In some embodiments, data centers use an amount of energy for each function performed by the data center or components thereof. For example, data centers or systems including data centers may use a specific amount of energy per amount of data center cooling. In some aspects, data centers or systems including data centers have a degree of energy efficiency that may be quantified as the power usage effectiveness (PUE) of the data center or system including a data center (e.g., a PUE of 1.0; 1.1; 1.2; 1.3; 1.4; 1.5; 1.6; 1.7; 1.8; 1.9; or 2.0). The PUE is the ratio of the total power entering a system (e.g., a data center and optionally, a desalination plant and/or a data center power source, such as a power plant) to the power used by the computer systems and/or associated components (e.g., information technology equipment) within the system (e.g., the data center). In various aspects, a PUE is the inverse of the data center infrastructure efficiency (DCIE). In some versions, systems (e.g., data centers) have a PUE of 2.0 or less, such as 1.9 or less, e.g., 1.8, 1.7, 1.6., 1.5, 1.4, 1.3, 1.2 or 1.1 or less (e.g., a PUE ranging from 1.0 to 2.0). In some embodiments, a system (e.g., a data center) has a PUE ranging from 1.0 to 1.3. In some instances, a system, (e.g., a data center) has a PUE of or about 1.0, where a PUE of or about 1.0 is a PUE near, and greater than, 1.0 (e.g., 1.01 or 1.02 or 1.03 or 1.04 or 1.05 or 1.06 or 1.07 or 1.08 or 1.09 or 1.1 or 1.15 or 1.2 or 1.25 or 1.3 and/or within the range 1.01 to 1.30). In determining the PUE of data centers of the invention, one may factor in a component that represents the reduced energy used by the desalination plant in desalinating the warm water output of the data center cooling subsystem. Any convenient protocol for factoring in this component into the PUE determination may be employed. For example, the reduction in energy used by the desalination plant resulting from co-location of the desalination plant with the data center (and particularly by using the warm output water from the data center) may be added to the amount of energy input into the data center which is used by the computer systems and/or associated components (e.g., information technology equipment). One particular formula that may be employed is:

$$PUE = \text{Total Facility Power/IT Equipment Power}$$

Where total facility power includes cooling and lighting, as well as anything that is not considered a computing device, whereas IT equipment is computing devices A PUE of 1.0 is ideal meaning that all the power is going to computing devices. A PUE of less than 2.0 is desirable, such as less than 1.5, and including less than 1.1, e.g., below 1.01. By performing the cooling with cool sea water, then only the cost of pumping the water adds to total facility power.

Where desired, data centers may include environmental control systems (e.g., one or more air conditioning units) for controlling at least a portion of the environment with a data center, e.g., to counter the heat produced by the data center components. In some aspects, environmental control systems include the water cooling subsystems described herein. In some aspects, environmental control systems include temperature control systems that are configured to heat and/or cool at least a portion of the data centers. In some instances, environmental control systems include humidity control systems that are configured to control the amount of humidity in at least a portion of the data centers. In some aspects, environmental control systems include pressure control systems that are configured to control the pressure level in at least a portion of the data centers. Some versions of environmental control systems are configured to maintain at least a portion of a data center and/or computer related equipment therein at a temperature between 16° C. and 24° C. (e.g., 17° C.; 18° C.; 19° C.; 20° C.; 21° C.; 22° C. or 23° C.) and/or within a humidity range of 40%-55% and/or with a maximum dew point of 15° C.

In various instances, and as noted above, data centers include one or more water cooling subsystems. The phrases "water cooling subsystem" and "water cooling subsystems", as used herein, refer to an interconnected structure located at least partially within a data center that is configured to cool at least one component (e.g., a server) or portion (e.g., a room) of the data center. Where desired, the interconnected structure of a water cooling subsystem includes one or more components (e.g., pipes and/or containers) configured to carry water from one location (e.g., the location of the intake) to another location. In some embodiments, water cooling subsystems include a warm water discharge and/or output. In some embodiments, water cooling subsystems are water-tight except for an intake for receiving water into the subsystems and warm water discharge and/or output for discharging water out of the subsystems. The water cooling subsystem, in some instances, may be configured to receive water (e.g., cool water) from an ocean and/or sea and/or river and/or lake and/or groundwater source and/or other water source.

The term "water", as used herein, refers to the chemical compound having the chemical formula $H_2O$. Water may also be salt water (e.g., seawater) and as such may include one or more components (e.g., salts) dissolved therein. Salt water (e.g., seawater) may have a salinity of about 3.5% (35 g/L, or 599 mM) (e.g., a salinity of 3.4% to 3.6% or 3.1% to 3.8%). Water may also be in the form of a liquid and/or gas. Water, as described in the application, may also have a variety of different temperatures. By "cool" water, as used herein, is meant water that has a lower temperature than "warm" water, as described herein. In some aspects the temperature of cool water is within the range 1° C. to 35° C. For example, in some instances the temperature of cool water is within one of the following ranges: 1° C. to 10° C.; 11° C. to 20° C.; 21° C. to 30° C.; 31° C. to 35° C.; 12° C. to 19° C.; 13° C. to 18° C.; 14° C. to 17° C.; 15° C. to 16° C.; 1° C. to 20° C.; 2° C. to 19° C.; 3° C. to 18° C.; 4° C. to 17° C.; 5° C. to 16° C.; 6° C. to 15° C.; 7° C. to 14° C.; 7° C. to 13° C.; 8° C. to 12° C.; or 9° C. to 11° C. In some aspects, the temperature difference between cool water and warm water may range from 1° C. to 99° C. For example, the temperature difference between cool water and warm water may be 1° C.; 2° C.; 3° C.; 4° C.; 5° C.; 6° C.; 7° C.; 8° C.; 9° C.; 10° C.; 11° C.; 12° C.; 13° C.; 14° C.; 15° C.; 16° C.; 17° C.; 18° C.; 19° C.; 20° C.; 21° C.; 22° C.; 23° C.; 24° C.; 25° C.; 26° C.; 27° C.; 28° C.; 29° C.; 30° C.; 31° C.; 32° C.; 33° C.; 34° C.; 35° C.; 36° C.; 37° C.; 38° C.; 39° C.; 40° C.; 41° C.; 42° C.; 43° C.; 44° C.; 45° C.; 46° C.; 47° C.; 48° C.; 49° C.; 50° C.; 51° C.; 52° C.; 53° C.; 54° C.; 55° C.; 56° C.; 57° C.; 58° C.; 59° C.; 60° C.; 61° C.; 62° C.; 63° C.; 64° C.; 65° C.; 66° C.; 67° C.; 68° C.; 69° C.; 70° C.; 71° C.; 72° C.; 73° C.; 74° C.; 75° C.; 76° C.; 77° C.; 78° C.; 79° C.; 80° C.; 81° C.; 82° C.; 83° C.; 84° C.; 85° C.; 86° C.; 87° C.; 88° C.; 89° C.; 90° C.; 91° C.; 92° C.; 93° C.; 94° C.; 95° C.; 96° C.; 97° C.; 98° C.; or 99° C. The temperature difference between cool water and warm water may also be, for example, at least 1° C.; at least 2° C.; at least 3° C.; at least 4° C.; at least 5° C.; at least 10° C.; at least 15° C.; at least 20° C.; at least 25° C.; at least 30° C.; at least 35° C.; at least 40° C.; or at least 50° C., such as 1° C. or more; 2° C. or more; 3° C. or more; 4° C. or more; 5° C. or more; 10° C. or more; 15° C. or more; 20° C. or more; 25° C. or more; 30° C. or more; 35° C. or more; 40° C. or more; or 50° C. or more, where an upper limit to the above ranges is, in some instances, 100° C., such as 75° C. In some aspects, cool water may have a temperature within one of the above listed ranges when the cool water enters and/or exits a component of the systems described herein (e.g., the water intake). In some aspects, cool water may have the same temperature as the water source from which the cool water is taken. For example, cool water may have the same temperature as that of the portion of ocean or sea surrounding (e.g., a location at or within a distance of 1 m and/or 10 m and/or 100 m and/or 1000 m) that the system is located. In some aspects of the disclosed systems, the cool water is received into the systems from the underwater location of the ocean or sea where the system is located. In some instances, the temperature of cool water increases and/or decreases as the water progresses through the disclosed water cooling subsystem.

By "warm" water, as used herein, is meant water that has a higher temperature than "cool" water, as described herein. In some aspects the temperature of warm water is within the range 36° C. to 100° C. For example, in some instances the temperature of warm water is within one of the following ranges: 36° C. to 40° C.; 41° C. to 50° C.; 51° C. to 60° C.; 61° C. to 70° C.; 71° C. to 80° C.; 81° C. to 90° C.; 91° C. to 99° C.; 40° C. to 45° C.; 46° C. to 50° C.; 51° C. to 55° C.; 56° C. to 60° C.; 61° C. to 65° C.; 66° C. to 70° C.; 36° C. to 60° C.; 37° C. to 59° C.; 38° C. to 58° C.; 39° C. to 57° C.; 40° C. to 56° C.; 41° C. to 55° C.; 42° C. to 54° C.; 43° C. to 53° C.; 44° C. to 52° C.; 45° C. to 51° C.; 46° C. to 50° C.; or 47° C. to 49° C. As noted above, in some instances, the temperature difference between cool water and warm water may range from 1° C. to 99° C. For example, the temperature difference between cool water and warm water may be, at least 1° C.; at least 2° C.; at least 3° C.; at least 4° C.; at least 5° C.; at least 10° C.; at least 15° C.; at least 20° C.; at least 25° C.; at least 30° C.; at least 35° C.; at least 40° C.; or at least 50° C. In some aspects, warm water may have a temperature within one of the above listed ranges when the warm water enters and/or exits a component of the systems described herein (e.g., the water discharge). In some aspects, warm water may have a higher temperature than the water source from which the cool water is taken. For example, warm water may have a higher temperature than that of the portion of ocean or sea surrounding (e.g., a location at or within a distance of 1 m and/or 10 m and/or 100 m and/or 1000 m) one or more elements of the system disclosed herein (e.g., a water intake and/or a water discharge). In some embodiments, the temperature of warm water increases and/or decreases as the water progresses through the disclosed systems.

In some aspects, the water cooling subsystem may be configured to carry cool water to at least one location in a data center (e.g., a location where heat is produced by the data center) where the cool water is heated and thereby converted to warm water. Cool water may be heated and converted to warm water within a heat exchange element of a water cooling subsystem, which is described in further detail below. The water cooling subsystem may also, in some instances, be configured to carry warm water away from one location in a data center (e.g., the location of a heat exchange element) to another location (e.g., a location outside a portion of the data center which contains one or more computer systems and/or associated components). Where desired, the water cooling subsystem is configured to carry heat energy away from one or more computer systems and/or associated components that generate heat energy by allowing generated heat energy to be transferred to water (e.g. cool water) within the water cooling subsystem (e.g., within a heat exchange element of the water cooling subsystem) and thereafter, transferring the heated water (e.g., warm water) away from the position within the data center where it was heated. By transferring water within a data center and thereby cooling one or more computer systems and/or associated components within the data center, the water cooling subsystem optimizes the operation of the systems and/or components by providing an environment in which the systems and/or components may effectively operate.

In some instances, water cooling subsystems include a heat exchange element. In some embodiments, heat exchange elements are configured to cool one or more locations and/or components within a data center. For example, heat exchange elements may be configured to allow an exchange of heat produced by a data center at a first location to a medium (e.g., air and/or water) and thereafter transfer the heated medium to a second location so that the first location of the data center and/or components at the first location are cooled. In some aspects, heat exchange elements are configured such that a medium (e.g., cool water) may be channeled into the heat exchange element (e.g., from a first portion of the water cooling subsystem) and/or a medium (e.g., warm water) may be channeled out of the heat exchange element (e.g., to a second portion of the water cooling subsystem).

In some aspects, a heat exchange element is an air conditioning system (e.g., one or more air conditioning units). In some instances, heat exchange elements are configured to cool air around (e.g., in the same room of a data center as data center components) components (e.g., electrical components) of the data center which produce heat. In some instances, heat exchange elements are configured to allow the transfer of heat from air (e.g., air heated by data center components) around (e.g., in the same room of a data center as data center components) components (e.g., electrical components) of the data center which produce heat to cool water. Such an exchange will result in the air being cooled and the water being warmed (e.g., to warm water). Accordingly, in some aspects, cool water is heated to warm water within the heat exchange element. In some instances, heat exchange elements are configured to remove air that has been heated by components of a data center from the area of the data center (e.g., room) in which the components are located.

In some embodiments, heat exchange elements are one or more channels (e.g., channels having a large interior and/or exterior surface area) physically integrated with components of a data center (e.g., electronic components which produce heat). Where desired, heat exchange elements are configured such that water may flow through them and thereby transfer heat away from the data center components. In some versions, the heat exchange element is operably connected to the remainder of the water cooling subsystem at one or more locations (e.g., one, two, three, four or five locations). In some aspects, the heat exchange element is composed of the same materials as the remainder of the water cooling subsystem or different materials. Examples of heat exchange elements that may be utilized either wholly or partially in connection with the disclosed systems are provided by U.S. Pat. Nos. 6,374,627; 8,0094,30; 7,525,207; 7,347,058; 8,004,832; 7,810,341; 7,808,780; 6,574,104; 6,859,366; 8,157,626; 7,881,057; 6,980,433; 6,945,058; 6,854,284; 6,834,512; 6,775,997; 6,772,604; 8,113,010; 8,276,397; and 8453,471 as well as those described in U.S. Published Patent Application Nos. 20120138259; 20110225997; 20110059687; 20100107658; and 20100146996; the disclosures of each which are incorporated by reference herein.

As noted above, in some embodiments, water cooling subsystems include a warm water discharge and/or warm water output. In various instances, warm water discharges are operably connected (e.g., attached in a water-tight manner) to desalination subunits of the systems. In some versions, warm water discharges are part of the same structure as the coupling components described herein. Where desired, warm water discharges expel warm water out of a water cooling subsystem and/or into a water source or body of water. In some embodiments, warm water discharges include one or more openings through which warm water may move (e.g., flow). In some embodiments, a warm water discharge is a pipe and may be made of the same and/or different materials and/or types of materials as the water intakes described herein. In some versions, a warm water discharge is positioned inside or outside a portion of the data center which contains one or more computer systems and/or associated components.

The water cooling subsystem, in some embodiments, includes a water intake. In some aspects, the water intake includes one or more openings (e.g., holes, gaps and/or slits) in the water cooling system configured to receive water (e.g., cool water) into the water cooling subsystem. For example, the water intake may be one or more pipes having one or more (i.e., one, two, three, four, five, six, seven, eight, nine, or ten or more) openings (e.g., an open end) positioned within a body of water such that water may flow into the one or more pipes. In some embodiments, a water intake or an opening therein is shaped as a circle, rectangle, square, slit, polygon, quadrilateral, oval, semi-circle, or other shape. In some instances, a water intake or an opening therein may have a single defined radius of symmetry. In some versions, a water intake or an opening therein may radii of curvature lying within a single plane (e.g., a vertical plane or a horizontal plane). In some embodiments, water intakes (e.g., one or more openings in water intakes) are configured to intake or otherwise have an amount of water (e.g., seawater) move through them in a set time period (e.g., a minute or hour or day). For example, water intakes may be configured to intake up to: 5,000 L/day; 10,000 L/day; 15,000 L/day; 20,000 L/day; 25,000 L/day; 30,000 L/day; 35,000 L/day; 40,000 L/day; 45,000 L/day; 50,000 L/day; 55,000 L/day; 60,000 L/day; 65,000 L/day; 70,000 L/day; 75,000 L/day; 80,000 L/day; 85,000 L/day; 90,000 L/day; 95,000 L/day; 100,000 L/day; 150,000 L/day; 200,000 L/day; 250,000 L/day; 300,000 L/day; 350,000 L/day; 400,000 L/day; 450,000 L/day; 500,000 L/day; 550,000 L/day; 600,000 L/day; 650,000 L/day; 700,000 L/day; 750,000 L/day; 800,000 L/day; 850,000 L/day; 900,000 L/day; 950,000 L/day; 1 million L/day; 5 million L/day; 10 million L/day; 20 million L/day; 30 million L/day; 40 million L/day; 50 million L/day; 60 million L/day; 70 million L/day; 80 million L/day; 90 million L/day; 100 million L/day; 110 million L/day; 120 million L/day; 130 million L/day; 140 million L/day; 150 million L/day; 160 million L/day; 170 million L/day; 180 million L/day; 190 million L/day; 200 million L/day; 220 million L/day; 240 million L/day; 260 million L/day; 280 million L/day; 300 million L/day; 400 million L/day; 500 million L/day; or 1 billion L/day. Water intakes may also be configured to intake more than 1 billion L/day. Water intakes, in some embodiments, may be configured to intake an amount of water in any of the ranges: 5,000 L/day to 1 billion L/day; 5,000 L/day to 1 million L/day; 5,000 L/day to 100 million L/day; 5,000 L/day to 20,000 L/day; 20,000 L/day to 40,000 L/day; 40,000 L/day to 60,000 L/day; 60,000 L/day to 80,000 L/day; 80,000 L/day to 100,000 L/day; 100,000 L/day to 120,000 L/day; 120,000 L/day to 140,000 L/day; 140,000 L/day to 160,000 L/day; 160,000 L/day to 180,000 L/day; 180,000 L/day to 200,000 L/day; 200,000 L/day to 250,000 L/day; 250,000 L/day to 300,000 L/day; 3000,000 L/day to 350,000 L/day; 100,000 L/day to 200,000 L/day; 200,000 L/day to 300,000 L/day; 300,000 L/day to 400,000 L/day; 400,000 L/day to 500,000 L/day; 500,000 L/day to 600,000 L/day; 600,000 L/day to 700,000 L/day; 700,000 L/day to 800,000 L/day; 800,000 L/day to 900,000 L/day; 900,000 L/day to 1 million L/day; 1 million L/day to 20 million L/day; 20 million L/day to 40 million L/day; 40 million L/day to 60 million L/day; 60 million L/day to 80 million L/day; or 80 million L/day to 100 million L/day. In some aspects, intakes are configured such that the amount of water moving (e.g., flowing) through an intake may be variable within a time period (e.g., one minute, one hour, one day, one month, one year). In some aspects, the water intake or a portion thereof is positioned outside the portion of the data center containing the one or more computer systems and/or associated components. For example, in some variations, the water intake is positioned outside the housing of the one or more computer systems and/or associated components. Where desired, the intake is in fluid communication with at least one portion of the water cooling subsystem located inside the portion of the data center containing the one or more computer systems and/or associated components wherein cool water is heated (e.g., heated to warm water). The water intake is, in some instances, fluidically coupled to the underwater location where the system is located, e.g., to obtain water from the underwater location where the system is located.

Embodiments of water cooling subsystems, and in some versions water intakes, include one or more filters configured for purifying water. In some instances, at least one filter is located at one or more openings in the intake and/or at the end of the intake furthest from the portion of the data center housing the computer systems and/or related equipment. Where desired, a filter is positioned within the portion of the data center housing the computer systems and/or related equipment.

Water cooling subsystems and/or water intakes thereof may, in various embodiments, be composed of one or more materials or one or more types of materials. Examples of materials that the water cooling subsystems of the disclosed systems may be composed of include polymers, ceramics, metals, glasses and/or a combination thereof. In some instances, the water cooling subsystems are not composed of metal or material that is subject to corrosion (e.g., corrosion by rust). In some embodiments, water cooling subsystems are composed of plumbing materials. For example, water cooling subsystems may be composed of polyvinyl chloride (PVC) pipes and/or joints and one or more adhesives for fastening the pipes in a water-tight manner. Where appropriate, one or more materials of the water cooling subsystems may be rigid. In some aspects, one or more materials of the water cooling subsystems may be flexible (e.g., one or more rubber tubes or hoses). However, these examples of materials are not limiting and the materials of the water cooling subsystems may be any material, or combination of materials, having the structural and chemical properties necessary to function in the disclosed systems as described herein.

The water cooling subsystem, in various instances, includes a pump. In some embodiments, a pump is a means for causing water to move through water cooling subsystems and/or other components (e.g., water intakes; water discharges and/or desalination plants), as described herein. In some variations, a pump causes water to move unidirectionally or bidirectionally through water cooling subsystems and/or other components (e.g., water intakes; water discharges and/or desalination plants), as described herein. In some instances, a pump is electrically powered and/or fossil fuel powered and/or powered by another means. In some aspects, a pump is operably connected to a power source (i.e., the power source of the data center), as described herein. In some aspects, a pump may be operably connected to a power plant. In particular versions, tides, and/or a pump powered by tides, cause water to move through the water cooling subsystems and/or other components (i.e., desalination plants) described herein. In some embodiments, one or more pumps are located within data centers and/or desalination subunits, as described herein. In some embodiments, one or more pumps are located outside data centers and/or desalination subunits, as described herein.

In particular aspects, water cooling subsystems include one or more valves within the subsystems for controlling the movement of water through the system. In some embodiments, the valves are controllable (e.g., configured to be opened and/or closed in reaction to a designated signal or action). Where desired, each valve is individually controllable (e.g., a valve may be opened and or closed while other valves are not). In some embodiments, the one or more valves include electrical components and may be configured to receive an electronic signal from a controller operably connected thereto.

The data center is present in a housing suitable to maintain the operability of the data center at the underwater location. As such, the housing may be a housing configured to protect electrical components of the data center from contact with the water, e.g., by being a water tight housing and/or a housing in which any water ingress is readily countered by water egress. The housing may be fabricated using any convenient material(s) according to any convenient design, where the interior of the housing may vary, ranging in some instances from 1 to 10,000 $m^3$, such as 5 to 5,000 $m^3$.

Water Desalination Subunit

As reviewed above, the disclosed systems include a desalination subunit. As used herein, the term "desalination subunit" refers to a device configured and/or used for desalinating water. As such, desalination subunits house components for desalinating water. In some embodiments of the disclosed systems, desalination is removing an amount of salt and/or other minerals or components from saline water so that the water is fit for consumption by a living organism (i.e., a living organism may consume the water and thereby maintain a healthy hydration level and/or a living organism may consume the water without the water having a detrimental effect on the organism's health). In some embodiments of the disclosed systems, desalination makes water potable (i.e., fit to drink; drinkable). In some embodiments the living organism is a "mammal" or "mammalian", where these terms are used broadly to describe organisms which are within the class mammalia, including the orders carnivore (e.g., dogs and cats), rodentia (e.g., mice, guinea pigs, and rats), and primates (e.g., humans, chimpanzees, and monkeys). In some embodiments, the living organism is a human. The term "human" may include human subjects of both genders and at any stage of development (e.g., fetal, neonates, infant, juvenile, adolescent, adult), where in some embodiments the human subject is a juvenile, adolescent or adult. In some embodiments of the disclosed systems, desalination is removing an amount of salt and/or other minerals or components from saline water so that the water is fit for a specific purpose (e.g., irrigation).

In some instances, the desalination subunits house components operate by exposure of one or more membranes, such as nanofiltration (NF) or reverse osmosis (RO) membranes, to the hydrostatic pressure of a natural or induced water column, for example, high-pressure water in the depths of a body of water (e.g., ocean or sea), such as the underwater location at which the subunits are co-located. The desalination subunits may utilize membrane modules of various configurations. In some instances, the membrane module employs a membrane system wherein two parallel membrane sheets are held apart by permeate spacers, and wherein the volume between the membrane sheets is enclosed. Permeate water passes through the membranes and into the enclosed volume, where it is collected. In some embodiments, desalination subjects of the disclosed systems are reverse osmosis desalination subunits. In some aspects, reverse osmosis desalination subunits use pressure and/or one or more semipermeable membranes to desalinate water. In some versions of reverse osmosis desalination subunits, water is passed through one or more semipermeable membranes in order to remove salt and/or minerals and/or other impurities therefrom. In some instances, the efficiency of a desalination process of a reverse osmosis desalination plant is higher if the temperature of the water input (e.g., saltwater) into the desalination process is higher. In various embodiments, a desalination process of a reverse osmosis desalination plant uses less energy per volume of water desalinated if the temperature of the water input (e.g., saltwater) into the desalination process is higher.

By desalinating water, in some aspects, desalination subunits produce desalinated water and/or brine (e.g., both desalinated water and brine). As used herein, the term "brine" refers to a solution discharged from a desalination subunit. In some aspects, brine may be a solution (e.g., a concentrate) including salt (e.g., sodium chloride) and water. In some versions, brine has a salt concentration in the range 3.5% to 26%. In some embodiments, brine includes one or more of the impurities removed from water during desalination (e.g., minerals or other components). In some instances, brine may include residues of chemicals used to treat (e.g., clean) a desalination plant.

Embodiments of desalination plants include at least one filter configured for purifying water. In some aspects, the at least one filter of the water intakes includes one or more semipermeable membranes.

In some instances, desalination subunits are configured such that an amount of water may move through the plants. In some embodiments, desalination subunits are configured such that an amount of water may move through the plants by traveling through an interconnected desalination structure of operably connected pipes and/or containers. The interconnected desalination structure of operably connected pipes and/or containers, in some variations, is composed of the same and/or different materials or types of materials as the water cooling subsystems and/or water intakes described above. In particular embodiments, the interconnected desalination structure of operably connected pipes and/or containers of a desalination subunit is connected to and/or includes a coupling component for receiving water from a water source and/or a water discharge for discharging water from the desalination subunit.

In some versions, desalination subunits include one or more valves for controlling the movement of water through the desalination plant (e.g., through an interconnected desalination structure of operably connected pipes and/or containers within a desalination plant). In some embodiments, the valves are controllable (e.g., configured to be opened and/or closed in reaction to a designated signal or action). In some aspects each valve is individually controllable (e.g., a valve may be opened and or closed while other valves are not). In some instances, the one or more valves include electrical components and may be configured to receive an electronic signal from a controller operably connected thereto.

In various aspects, a desalination subunit is configured such that water can move (i.e., flow) into the plant from a water source (e.g., a water cooling subsystem). In some embodiments, the water source of a water desalination subunit is the water cooling subsystem of the data centers subunit of the system (e.g., a co-located data center). As such, where desired, water desalination subunits may be configured to receive warm water from water cooling subsystems or a portion thereof (e.g., a warm water discharge or output). In some embodiments, water desalination subunits are configured such that warm water received into a desalination plant is used in one or more water desalination processes therein.

In some versions, desalination subunits include one or more coupling components. Coupling components may be configured for connecting to and receiving water from a water cooling subsystem. In some aspects, one or more coupling components are positioned within a desalination subunit and/or within a data center and/or between a desalination subunit and a data center (e.g., at the interface of a desalination subunit and data center). In some instances, the one or one or more coupling components are a pipe or a series of pipes for providing fluid communication between the desalination subunit and data center. In some embodiments, the one or more coupling components are operably connected (e.g., attached in a water-tight manner) to a warm water discharge or output of a data center. The one or more coupling components may be operably connected to a water intake (e.g., a cool water intake), as described herein. As such, water (e.g., cool water) may be added to the warm water passing out of the water cooling subsystem of a data center before it enters a desalination subunit. The one or more coupling components may be operably connected to a water discharge (e.g., a warm water discharge), as described herein. As such, all or a portion of the water channeled to flow through the coupling component may be channeled to flow into a water source and all or a portion of the water channeled to flow through the coupling component may be channeled to flow into the water desalination plant. The one or more coupling components may also be operably connected to one or more other coupling components.

In some embodiments, coupling components are configured to have an amount of water (e.g., seawater) move (e.g., flow) through them per time period (e.g., minute or hour or day). For example, coupling components may be configured to have up to the following amounts of water move (e.g., flow) through them: 5,000 L/day; 10,000 L/day; 15,000 L/day; 20,000 L/day; 25,000 L/day; 30,000 L/day; 35,000 L/day; 40,000 L/day; 45,000 L/day; 50,000 L/day; 55,000 L/day; 60,000 L/day; 65,000 L/day; 70,000 L/day; 75,000 L/day; 80,000 L/day; 85,000 L/day; 90,000 L/day; 95,000 L/day; 100,000 L/day; 150,000 L/day; 200,000 L/day; 250,000 L/day; 300,000 L/day; 350,000 L/day; 400,000 L/day; 450,000 L/day; 500,000 L/day; 550,000 L/day; 600,000 L/day; 650,000 L/day; 700,000 L/day; 750,000 L/day; 800,000 L/day; 850,000 L/day; 900,000 L/day; 950,000 L/day; 1 million L/day; 5 million L/day; 10 million L/day; 20 million L/day; 30 million L/day; 40 million L/day; 50 million L/day; 60 million L/day; 70 million L/day; 80 million L/day; 90 million L/day; 100 million L/day; 110 million L/day; 120 million L/day; 130 million L/day; 140 million L/day; 150 million L/day; 160 million L/day; 170 million L/day; 180 million L/day; 190 million L/day; 200 million L/day; 220 million L/day; 240 million L/day; 260 million L/day; 280 million L/day; 300 million L/day; 400 million L/day; 500 million L/day; or 1 billion L/day. Coupling components may also be configured to have more than 1 billion L/day of water move (e.g., flow) through them. Coupling components, in particular embodiments, may be configured to have an amount of water move through them wherein the amount is in any of the ranges: 5,000 L/day to 1 billion L/day; 5,000 L/day to 1 million L/day; 5,000 L/day to 100 million L/day; 5,000 L/day to 20,000 L/day; 20,000

L/day to 40,000 L/day; 40,000 L/day to 60,000 L/day; 60,000 L/day to 80,000 L/day; 80,000 L/day to 100,000 L/day; 100,000 L/day to 120,000 L/day; 120,000 L/day to 140,000 L/day; 140,000 L/day to 160,000 L/day; 160,000 L/day to 180,000 L/day; 180,000 L/day to 200,000 L/day; 200,000 L/day to 250,000 L/day; 250,000 L/day to 300,000 L/day; 3000,000 L/day to 350,000 L/day; 100,000 L/day to 200,000 L/day; 200,000 L/day to 300,000 L/day; 300,000 L/day to 400,000 L/day; 400,000 L/day to 500,000 L/day; 500,000 L/day to 600,000 L/day; 600,000 L/day to 700,000 L/day; 700,000 L/day to 800,000 L/day; 800,000 L/day to 900,000 L/day; 900,000 L/day to 1 million L/day; 1 million L/day to 20 million L/day; 20 million L/day to 40 million L/day; 40 million L/day to 60 million L/day; 60 million L/day to 80 million L/day; or 80 million L/day to 100 million L/day. In some aspects, the amount of water moving (e.g., flowing) through a coupling component is variable within a time period (e.g., one minute, one hour, one day, one month, one year).

A desalination subunit, in some embodiments, is configured such that brine moves (i.e., flows) out of the desalination subunit through a water discharge. In some instances, desalination subunits are operably connected to (e.g., in fluid communication with) water discharges, as described herein, where the discharge may conveniently discharge the brine into the underwater location at which the system is located.

A desalination subunit, in various aspects, is configured such that desalinated (e.g., water having a low salt concentration) moves out of the desalination subunit through a water expulsion component, e.g., a product water conveyor configured to convey product water from the desalination subunit to a water surface location. The water expulsion component may be one or more pipes. The water expulsion component may also be configured to transport the desalinated water to a location where the desalinated water may be used and/or stored, e.g., a land location. The water expulsion component may, in some aspects, also be configured to transport the desalinated water to a location from which the desalinated water can be further transported.

Desalination subunits, in some versions, include a pump. In some embodiments, a pump is a means for causing water to move through desalination subunit and/or other components (e.g., data centers; water cooling subsystems; water intakes; and/or water discharges), as described herein. In particular instances, a pump causes water to move unidirectionally or bidirectionally through desalination plants and/or other components, as described herein. In some embodiments, a pump is electrically powered and/or gasoline powered and/or powered by another means. In some aspects, a pump is operably connected to a power source (i.e., the power source of the data center), as described herein. In some instances, a pump may be operably connected to a power plant. In particular embodiments, tides, and/or a pump powered by tides, cause water to move through the desalination plants and/or other components (i.e., data centers) described herein. In some embodiments, one or more pumps are located within data centers and/or desalination plants, as described herein. In some versions, one or more pumps are located outside data centers and/or desalination subunits, as described herein.

Where desired, desalination subunits include electrical components. For example, desalination subunits may include temperature and/or lighting control systems as well as electrical systems for desalinating water. In some aspects, desalination subunits (e.g., desalination subunits operating independently) use an amount of energy (e.g., electrical energy) for each volume of water desalinated. Where desired, desalination subunits may be operably connected to at least one power producing subunit, e.g., as described herein). Some embodiments of desalination subunits include a power source (e.g., a source from which electrical power may be obtained). Power sources, where appropriate, and as described above, generate or obtain power from renewable energy sources. In some aspects, desalination subunits may be operably connected (e.g., electrically connected) to a data center or one or more of the components thereof.

As summarized above, the disclosed systems include one or more desalination subunits co-located with one or more data centers. As noted above, some embodiments of the disclosed systems include desalination subunits that are configured to receive and desalinate warm water output from a data center (e.g., a co-located data center). Some variations of the disclosed systems that include desalination subunits configured to receive and desalinate warm water output from a data center are thereby configured to produce fewer carbon emissions as compared to the same data center and water desalination subunit operating independently (e.g., a data center and water desalination plant not connected in a manner such that water or electricity may travel from one to the other). Also, in some instances, the disclosed systems include desalination subunits that are configured to receive and desalinate warm water output from a data center and are thereby configured to use less energy (e.g., electrical energy) as compared to the same data center and water desalination subunit operating independently (e.g., a data center and water desalination subunit not connected in a manner such that water or electricity may travel from one to the other).

As with the data center subunit, the water desalination subunit may be present in a housing suitable to maintain the operability of the water desalination subunit at the underwater location. As such, the housing may be a housing configured to protect electrical components of the water desalination subunit from contact with the water, e.g., by being a water tight housing and/or a housing in which any water ingress is readily countered by water egress. The housing may be fabricated using any convenient material(s) according to any convenient design, where the interior of the housing may vary, ranging in some instances from 1 to 10,000 m$^3$, such as 5 to 5,000 m$^3$.

Power Producing Subunit

In some aspects, the disclosed systems include one or more power producing subunits. As used herein, the phrase "power producing subunit" refers to a facility for the generation of electric power. In some aspects, power producing subunits house components for generating and transmitting electric power.

The power producing subunit may be any convenient type of power producing facility, including but not limited to those that generate electrical power from fossil fuels (e.g., coal, oil, and/or natural gas), nuclear power or renewable energy sources, e.g., solar, wind, wave, geothermal, or other types of renewable energy sources.

When present in systems of the invention, the power producing subunit may be located at a location operably connected to at least one of the data center and the water desalination subunits, where the location may be, in some instances, at an underwater, e.g., seafloor or above seafloor, or water surface location, as desired. Power producing subunits, in some aspects, are operably connected to a data center and/or a water desalination plant. Various embodiments of power producing subunits provide electrical power to data centers (e.g. data centers of the systems) and/or desalination subunits (e.g., desalination subunits of the systems). As such, some versions of the disclosed systems include power producing subunits that are electrically connected (e.g., connected by at least one conductive material, such as a metal cable) to a data center and/or a water desalination subunit. In some aspects, power producing subunits may provide all or a portion of the electrical power required to operate the data center and/or the electrical components therein. Similarly, in some instances, the power producing subunit may provide all or a portion of the electrical power required to operate a desalination subunit and/or the electrical components therein.

Where the power producing unit is present at a water surface location, the water surface location at which the power producing subunit, when present, may be located is one that provides for the operative communication between the power producing subunit and the data center and/or water desalination subunit. The water surface location may be positioned on the surface of the body of water directly above the underwater location of the data center/water desalination subunits, or to one side of such a location. While the distance between the surface location and the underwater location may vary, in some instances the distance ranges from 15 to 5000 m, such as a 50 to 2500 m, including 50 to 1000 m. The power producing subunit may be on a floating or non-floating structure, e.g., a floating or non-floating platform, where the structure may be fixed or non-fixed to the floor of the body of water.

Where the power producing unit is present at a below water surface location, the below water surface location at which the power producing subunit, when present, may be located is one that provides for the operative communication between the power producing subunit and the data center and/or water desalination subunit. The below water surface location may be positioned on or above the sea floor substantially the same location as the underwater location of the data center/water desalination subunits, or proximal to such a location. While the distance between the two locations may vary, in some instances the distance ranges from 15 to 5000 m, such as a 50 to 2500 m, including 50 to 1000 m. The power producing subunit may be on a floating or non-floating structure, e.g., a floating or non-floating platform, where the structure may be fixed or non-fixed to the floor of the body of water.

Figure 2:
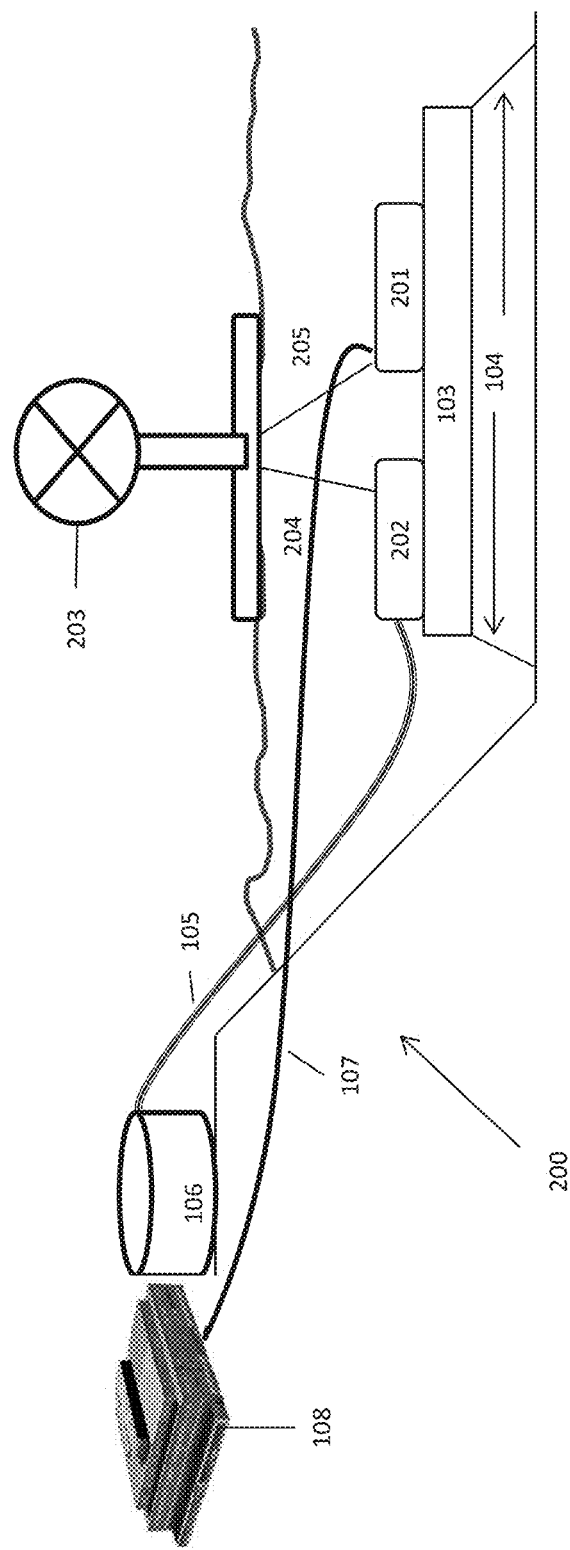
FIG. 2 is a diagram of an underwater system including co-located data center and water desalination subunits, wherein the system is operatively connected to a power producing subunit located at a water surface location, in accordance with an embodiment of the invention.

Some embodiments of the disclosed systems that include a power producing subunit are configured to produce fewer carbon emissions as compared to the same power producing subunit, data center and water desalination subunit operating independently (e.g., a power producing subunit, data center and water desalination subunit not connected in a manner such that water and/or electricity may travel from one to the other). Also, some variations of the disclosed systems that include a power producing subunit co-located with a data center and/or a desalination subunit are configured to use less energy (e.g., electrical energy) as compared to the same power producing subunit, data center and water desalination subunit operating independently (e.g., a power producing subunit, data center and water desalination subunit not connected in a manner such that water and/or electricity may travel from one to the other). As such, some versions of the disclosed systems that include a power producing subunit co-located with a data center and/or a desalination subunit are configured to be more energy-efficient than the same power producing subunit, data center and water desalination subunit operating independently FIG. 1 provides a diagram of one embodiment of a disclosed system 100 including a data center 101 and a water desalination subunit 102 co-located at an underwater location. The data center 101 and desalination subunit are co-located on a platform 103 which is tethered to the floor of an ocean at a depth of 200 to 250 m by way of cables 104. Also shown is product water conveyer 105 which conveys freshwater from the desalination subunit 102 to a land location 106 for further use. Also shown is data transmission line 107 which provides for operative communication between the data center and a land location 108. Of course, this may be replaced by a suitable wireless communication element. In some instances, and as depicted by the diagram of FIG. 2, a subject system 200 may include many of the same components and aspects illustrated in FIG. 1, including a data center 201, a water desalination subunit 202 co-located with the data center, and may also include a power producing subunit 203 (in the form of wind turbine) operably connected with the data center and the water desalination subunit by operable connections 204, 205 (e.g., connections through which electric power may be transmitted) between the power producing subunit, data center and/or desalination plant, and other components and aspects described herein. As shown, the power producing subunit 203 is positioned at a surface location above the underwater location.

Methods

As summarized above, aspects of the present disclosure also include methods for cooling a data center and desalinating salt water. In some embodiments, the methods have steps (e.g., sequential steps and/or simultaneous steps) including (1) cooling a data center with a water cooling subsystem comprising a cool water intake and a warm water discharge, wherein the water cooling subsystem is configured to absorb heat produced by the data center; and (2) desalinating warm water received from the warm water discharge at a desalination plant that is co-located with the data center.

The word "cooling" is used broadly and generically to refer to lowering the temperature of an aspect (e.g., a data center or a portion of one or more components therein) or a portion of an aspect (e.g., a portion of a data center that is heated by one or more components of the data center). As such, in some embodiments, cooling a data center with a water cooling subsystem having a cool water intake and a warm water discharge includes lowering the temperature of at least a portion of the data center or one or more components of the data center using the water cooling subsystem.

As used herein, the phrase "cool water intake" refers to a water intake configured to receive cool water. In some embodiments, cooling a data center with a water cooling subsystem includes moving (e.g., intermittently or continually pumping) water (e.g., cool water) through at least a portion of the water cooling subsystem and/or absorbing heat produced by the data center using the water cooling subsystem and/or water pumped through the subsystem. In some instances, cooling a data center with a water cooling subsystem includes moving (e.g., pumping) water (e.g., warm water) through at least a portion of the water cooling subsystem after the water cooling subsystem and/or water therein has absorbed heat produced by the data center. In various embodiments, cooling a data center with a water cooling subsystem includes moving (e.g., pumping) water (e.g., warm water) out of the water cooling subsystem (e.g., pumping water through a warm water discharge of a water cooling subsystem). In some variations, cooling a data center with a water cooling subsystem includes moving (e.g., pumping) water (e.g., warm water) into a desalination plant.

The word "desalinating" is used broadly and generically to refer to conducting one or more processes (e.g., reverse osmosis) to desalinate water. As such, in some embodiments, desalinating water includes receiving water (e.g., warm water) from a warm water discharge of a data center into a desalination plant (e.g., a desalination plant co-located with the data center) and conducting one or more desalination processes to desalinate that water. In particular aspects of the methods, desalinating water includes receiving water (e.g., warm water) from a warm water discharge of a data center into a desalination plant (e.g., a desalination plant co-located with the data center) and conducting one or more desalination processes to desalinate the water. In some instances, desalinating water includes moving (e.g., intermittently or continually pumping) water (e.g., warm water) through one or more components of a desalination subunit and thereby desalinating the water.

In some versions of the disclosed methods, cooling a data center and desalinating salt water includes obtaining (e.g., intermittently or constantly pumping) water (e.g., seawater) from a cool water intake, e.g., located at the underwater location of the system. In some aspects of the disclosed methods, cooling a data center and desalinating salt water includes discharging (e.g., intermittently or constantly pumping) brine from a desalination plant into a body of water (e.g., an ocean or sea), e.g., at the underwater location of the system.

As noted above, in some embodiments, data centers, desalination plants and/or their power sources produce carbon emissions. In some aspects, data centers and/or desalination plants (e.g., desalination plants operating independently) produce an amount of carbon emissions for each function or portion of a function performed by the desalination plant or components thereof. For example, in some variations, desalination plants produce a certain amount of carbon emissions per volume of desalinated water produced.

Also, as noted above, co-locating and/or operably connecting a data center and desalination plant can reduce their overall carbon emissions. As such, in some instances, the disclosed methods of cooling a data center and desalinating salt water at a desalination plant co-located with the data center produce fewer carbon emissions as compared to operating the same data center and water desalination plant independently (e.g., a data center and water desalination plant not connected in a manner such that water or electricity may travel from one to the other). In some variations, the disclosed methods of cooling a data center and desalinating salt water at a desalination plant co-located with the data center include producing a smaller carbon footprint as compared to the same data center and water desalination plant operating independently.

In some instances, the disclosed methods of cooling a data center and desalinating salt water at a desalination plant co-located with the data center use less energy per amount of data-center cooling and per volume of water desalinated as compared to the same data center and water desalination subunit operating independently (e.g., a data center and water desalination plant not connected in a manner such that water or electricity may travel from one to the other). In some versions, the disclosed methods of cooling a data center and desalinating salt water at a desalination subunit co-located with the data center include cooling a data center and desalinating water in a more energy-efficient manner as compared to operating the same data center and water desalination plant independently.

In particular embodiments, the disclosed methods of cooling a data center and desalinating salt water at a desalination subunit co-located with the data center include maintaining the PUE (e.g., the PUE of the data center) at a particular value, such as 2.0 or less, e.g., 1.9, or less, 1.8 or less, 1.7 or less, 1.6 or less, 1.5 or less, 1.4 or less, 1.3 or less, 1.2 or less, 1.1 or less, where the particular value at which the data center is maintained may vary, e.g., a PUE of 1.0; 1.1; 1.2; 1.3; 1.4; or 1.5. In some instances, the disclosed methods of cooling a data center and desalinating salt water at a desalination subunit co-located with the data center include maintaining the PUE (e.g., the PUE of the data center) within a particular range (e.g., below 2; between 0 and 2; or between 1 and 2). For example, in some aspects, the disclosed methods of cooling a data center and desalinating salt water at a desalination subunit co-located with the data center include maintaining the PUE (e.g., the PUE of the data center) between 1 and 1.3 or at a value greater than 1 but approaching 1 (e.g., 1.1; 1.15; 1.2; 1.25; or 1.3).

In some versions, the disclosed methods of cooling a data center and desalinating salt water at a desalination subunit co-located with the data center include co-locating and/or operably connecting a data center, desalination subunit and power producing subunit. As such, in some embodiments, the disclosed methods include obtaining power to operate the data center and the desalination plant from a power producing subunit co-located with the data center and the desalination subunit. Also, as noted above, co-locating and/or operably connecting a data center, desalination subunit and power plant can reduce their overall carbon emissions. As such, in various instances, the disclosed methods of cooling a data center and desalinating salt water at a desalination subunit co-located with the data center that includes obtaining power to operate the data center and the desalination subunit from a power producing subunit co-located with the data center and the desalination plant produces fewer carbon emissions as compared to operating the same data center, water desalination subunit and power producing subunit operating independently. In some versions, the disclosed methods of cooling a data center and desalinating salt water co-located with the data center by obtaining power to operate the data center and the desalination subunit from a power producing subunit co-located with the data center and the desalination subunit includes producing a smaller carbon footprint as compared to the independent operation of the same subunits. In some instances, the disclosed methods of use less energy per amount of data-center cooling or per volume of water desalinated than the same data center, water desalination subunit and power producing subunit operating independently (e.g., operating while not operably connected). In some versions, the disclosed methods include cooling a data center, desalinating water and/or producing or obtaining power in a more energy-efficient manner as compared to operating the same subunits independently.

Utility

The subject systems and methods may be used to cool data centers and desalinate water. As described herein, in some aspects, the disclosed systems may be configured to operate in a way that is more effective than operating components of the systems independently, e.g., use less energy per amount of data-center cooling and/or per volume of water desalinated, minimize the impact, e.g., produce fewer carbon emissions or less thermal pollution, etc., as compared to the subunits operating independently. Accordingly, the subject systems and methods may be applied to minimize the amount of energy used by data centers, desalination plants and/or power plants. The subject systems and methods may also be applied to minimize the amount of carbon emissions from data centers, desalination plants and/or power plants. By enhancing efficiency of operation and minimizing carbon emissions, the disclosed systems and methods are useful to minimize costs associated with data centers, desalination plants and/or power plants and to promote the quality of the surrounding environments.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims. It is also to be understood that the terminology used herein is for the purpose of describing particular embodiments only, and is not intended to be limiting, since the scope of the present invention will be limited only by the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

What is claimed is:

1. A method of cooling a data center and desalinating water, the method comprising:
    (a) cooling a data center with a water cooling subsystem comprising a cool water intake and a warm water discharge; and
    (b) desalinating warm water received from the warm water discharge at a water desalination subunit to produce desalinated water;
    wherein the data center and water desalination subunit are co-located with each other at an underwater location from which the water cooling subsystem is configured to receive cool water.

2. The method according to claim 1, wherein the underwater location is an underwater location of an ocean or sea.

3. The method according to claim 2, wherein the underwater location is positioned below the photic zone of the ocean or sea.

4. The method according to claim 2, wherein the underwater location is positioned 15 m or more below the surface of the ocean or sea.

5. The method according to claim 4, wherein the underwater location is positioned 50 m or more below the surface of the ocean or sea.

6. The method according to claim 1, further comprising conveying a product water conveyor from the desalination subunit to a water surface location.

7. The method according to claim 1, further comprising discharging brine from the water desalination subunit.

8. The method according to claim 7, wherein the discharging is at the underwater location.

9. The method according to claim 1, wherein the water desalination subunit is a membrane-comprising desalination subunit.

10. The method according to claim 9, wherein the membrane-comprising desalination unit is a reverse osmosis desalination subunit.

11. The method according to claim 1, further comprising powering at least one of the data center and water desalination subunits with a power producing subunit located at a water surface location and operably connected to at least one of the data center and the water desalination subunits.

12. The method according to claim 11, wherein the power producing subunit is operably connected to both of the data center and water desalination subunits.

13. The method according to claim 11, wherein the power producing subunit is a renewable energy power producing subunit.

* * * * *